United States Patent [19]

Weiss et al.

[11] Patent Number: 4,939,622
[45] Date of Patent: Jul. 3, 1990

[54] REMOVABLE ELECTRICAL OR ELECTRONIC EQUIPMENT ASSEMBLY COMPRISING A BOX AND ITS HOUSING

[75] Inventors: Jean-Pierre Weiss, Argenteuil; René Estival, Saint Cloud; Pascal Noble, Eaubonne, all of France

[73] Assignee: Avions Marcel Dassault-Breguet Aviation, France

[21] Appl. No.: 334,458

[22] Filed: Apr. 7, 1989

[30] Foreign Application Priority Data

Apr. 11, 1988 [FR] France .............................. 88 04757

[51] Int. Cl.⁵ .......................................... H02B 11/12
[52] U.S. Cl. ................................................. 361/391
[58] Field of Search ............... 361/338, 339, 391, 390, 361/343, 344

[56] References Cited

U.S. PATENT DOCUMENTS 2,789,024 4/1957 Heisler ................................. 361/391
3,014,160 12/1961 Brogden .
3,289,044 11/1966 Ginsberg ............................. 361/391
4,744,001 5/1988 Kraft ................................... 361/391

FOREIGN PATENT DOCUMENTS 101204 2/1984 European Pat. Off. .
2049249 3/1971 France .

Primary Examiner—Roy N. Envall, Jr.
Attorney, Agent, or Firm—Watson, Cole, Grindle & Watson

[57] ABSTRACT

A removable box is provided for electrical or electronic equipment. A plug connection has elements respectively provided on the box and within an associated housing. Guide pieces are located on the box and housing which engage with one another to guide a sliding motion of the box generated by rotation of an endless screw within a housing rack. Rotation of the screw is blocked when the plug elements are engaged and rotation allowed when the elements are disengaged via a locking mechanism.

7 Claims, 2 Drawing Sheets

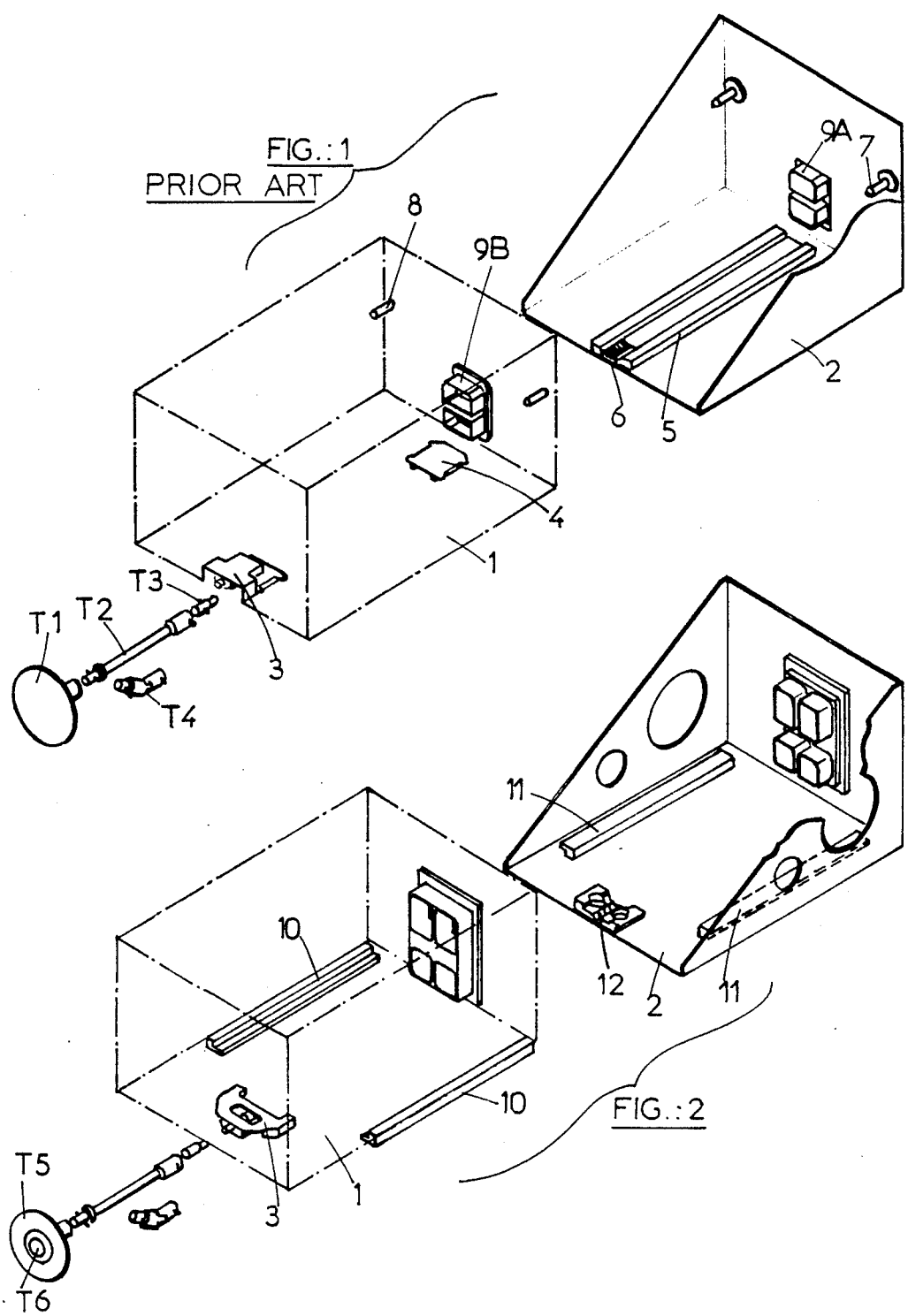

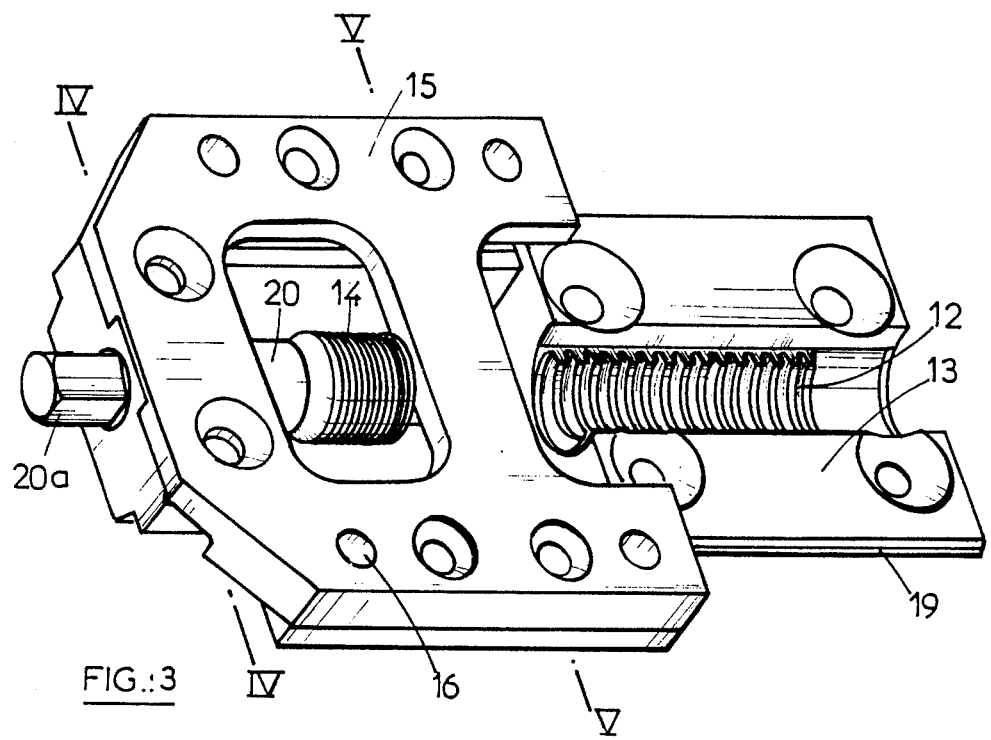
FIG.:3
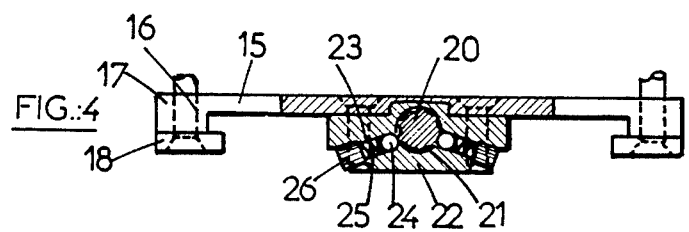
FIG.:4
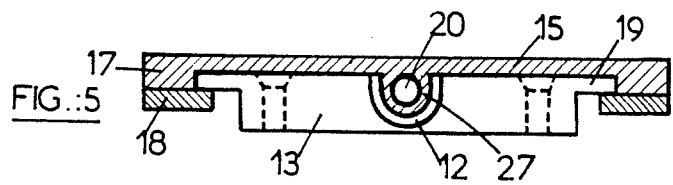
FIG.:5

REMOVABLE ELECTRICAL OR ELECTRONIC EQUIPMENT ASSEMBLY COMPRISING A BOX AND ITS HOUSING

BACKGROUND OF THE INVENTION

The present invention relates to a removable electrical or electronic equipment assembly which is of the type comprising a box or drawer and a housing capable of receiving the box and which is commonly called a "rack".

Installing an electronic box on board aircraft, helicopters or other vehicles presents more or less difficult problems of bulk, manipulation, positioning and then fastening or locking. The user wants to have systems allowing easy and rapid exchange, whilst at the same time remaining relatively robust and economical.

The extraction of a box from its housing can present problems, above all when it is heavy and the available space is limited. In fact, in addition to the weight to be overcome, it is usually necessary to exert considerable force for the plugging and unplugging of electrical connectors, especially since some box models have a large number of pins. There are also often seals for leakproofing or for mechanical protection or serving as an electromagnetic shield, which make it necessary to exert additional forces in order to insert or extract the box.

There are several systems for reducing the necessary forces: a handle with extracting cams, an articulated lever with a knurled nut, and a system comprising an endless screw and a rack. A system of this type, which is in common use, comprises, on the box, a lock support equipped with an endless screw driven in rotation by a shaft terminating in a machined hexagon intended for receiving an actuating tool. The housing intended for receiving the box possesses a rack which serves for interacting with the endless screw. This rack is connected to a slideway which guides the box when it is being inserted into or extracted from the housing. Furthermore, the box carries on its bottom, opposite the endless screw, a guide piece which interacts with the slideway.

In order to lock the box once it is in place, there are spring leaves which are fastened to the box and which penetrate into the notches of a gear wheel fixed to the endless screw. The form and arrangement of these springs are such that, when the tool is introduced in order to rotate the endless screw, the spring leaves are moved away from the said notches, thus allowing rotation to take place.

This system has some disadvantages, the most important of which arises as a result of the bulk of the component associated with the endless screw. This component penetrates inside the box and makes it complicated to provide the electrical or electronic equipment contained in this box, if a loss of space is to be avoided. Moreover, it is relatively heavy. In addition, the locking system formed by springs acting on a gear wheel can be distorted accidentally or as a result of the use of an unsuitable tool. Besides, the slideway integral with the rack constitutes an assembly which has to be machined with great accuracy and which is therefore relatively costly.

SUMMARY OF THE INVENTION

The object of the present invention is to provide an improved device which is less bulky, of lower weight and more reliable in operating terms, whilst at the same time being of as low a cost price as possible.

To achieve this result, the present invention provides a removable electrical or electronic equipment assembly comprising:
  a box containing electrical or electronic equipment,
  a housing capable of receiving the said box and equipped with slideways designed to interact with the guide pieces carried by the box for the insertion or extraction of the latter,
  at least one plug connector comprising two elements which are provided one on the box and the other on the housing and which are in connection when the box is completely engaged in the housing,
  clamping and extracting members capable of making it possible to move the box into the vicinity of its position of complete engagement in its housing by overcoming the frictional forces generated by the connector, these clamping and extracting members comprising an endless screw carried by the box and a corresponding rack carried by the housing, and
  means for blocking the rotation of the said endless screw and thereby immobilizing the box in the position of complete engagement,
  the particular feature of this device being that the said slideways carried by the housing are independent of the rack and are spaced from this.

Preferably, in the customary case where the box and its housing are parallelepipedic, the slideways or the guide pieces are located near the edges of the face of the box carrying the clamping and extracting means.

Advantageously, there are guide means independent of said slideways and guide pieces, these means being located near the endless screw and the rack and serving only to make it easier to engage these pieces with one another when the box comes into the vicinity of its position of complete engagement in the housing.

These measures make it possible to have slideways and guide pieces which are lighter, since they support less force because they are set apart from one another, and at the same time they can be of less accuracy, thus resulting in a lower cost price.

Advantageously too, especially in terms of bulk, when the endless screw can be driven in rotation by a rod equipped with a drive head intended for interacting with a tool, the endless screw is in one piece with the said rod and its drive head, and it is retained on a support connected to the box simply by means of two bearings, at least one of which is attached.

Preferably, said rod has grooves or serrations intended for interacting with at least one ball pushed by a spring, these grooves or serrations forming, with said ball and its spring, part of the means for blocking the screw.

Also preferably, the drive head of the endless screw is of such a form that it cannot be driven by a standard tool, and the assembly is associated with a special tool for driving the said head. Advantageously, the special tool possesses a torque limiter.

The invention will now be described in more detail by means of practical examples illustrated in the figures of which:

BRIEF DESCRIPTION OF THE DRAWING

FIG. 1 is an exploded perspective view of a device according to the prior art,

FIG. 2 is a similar view of the device according to the invention,

FIG. 3 is a perspective view of the support piece of the endless screw and of the rack, FIG. 4 is a cross-section along the line IV—IV of FIG. 3, FIG. 5 is a cross-section along the line V—V of FIG. 3.

DETAILED DESCRIPTION OF THE PREFERRED EMBODIMENT OF THE INVENTION

It will be seen that, in the figures, the box is shown horizontal, with the locking device carried by the bottom. However, it is possible for the box to be arranged otherwise, for example inclined or with the locking device placed, for example, on a side wall of the box. The words "base", "bottom", "vertical face", etc., are used in this text purely as an indication.

FIG. 1 shows a box 1, represented by dot-and-dash lines for greater clarity, and its housing 2, shown partially cut away. The reference 3 denotes an endless-screw support carried by the base of the box 1. The reference 4 designates a guide piece likewise carried by the base of the box 1, but axially opposite the component 3.

The housing 2 carries a slideway formed from two rails 5 arranged in the middle part of its bottom and integral with a rack 6 intended for interacting with the endless screw carried by the support 3. The slideway 5 interacts with corresponding surfaces carried by the component 3 and by the guide piece 4. Additional guide studs 7, carried by the vertical face of the housing 2 which is opposite the entrance of the latter, are intended for interacting with guide tubes 8 carried by the corresponding face of the box.

9A and 9B denote two parts of an electrical connector with multiple plugs carried respectively by the housing 2 and by the box 1. T1 designates a tool for driving the endless screw, with two interchangeable lengthening pieces T2, T3 and a cardan joint T4 which can be substituted for or added to the lengthening pieces T2 and T3.

In order to put the box in place in its housing, it is engaged until the guide piece 4 is made to coincide with the slideway 5, and then the box is pushed in order to slide it along the slideway, until the endless-screw support 3 interacts in turn with the slideway. To complete the introduction, the tool T1 is used, and this, by rotating the endless screw interacting with the rack 6, brings the box into its final position. A locking system, not shown in the figure, prevents an inopportune rotation of the endless screw which would result in a movement of the box. In order to remove the box, the tool T1 is used in such a way as to cause the box to cover the short distance corresponding to the separation of the parts 9A and 9B of the connector, this requiring considerable force. Thereafter, it is possible to continue the extraction of the box by hand.

In FIG. 2, the same elements bear the same references.

It can be seen that the box 1 carries a locking piece 3 of a different form from that shown in FIG. 1. This piece, which is broader and flatter and therefore less bulky, is illustrated in more detail in FIGS. 3 and 4. The box, towards its longitudinal edges, carries two slides 10 designed to interact with slideways 11 provided on the bottom of the box. There is no longer any guide piece 4.

The component carrying the rack 12 is therefore independent of the slideways 11.

FIGS. 3 and 4 show in detail the component 3 carrying the endless screw and the component 13 carrying rack 12. In FIG. 3, these two components are shown in the position of partial engagement, but the endless screw 14 being set apart from the rack 12. The component 3 comprises a plate 15 equipped with holes 16 for fastening it to the lower face of the box. The plate 15, at its lateral edges, carries an extra thickness 17 to which is fastened a plate 18 which is a little wider and which forms with the plate 15 a slot, into which the edge 19 of the component 13 engages so as to ensure good interaction between the endless screw 14 and the rack 12.

In an even simpler and lighter alternative version, the plate 15, the extra thickness 17 and the plate 18 are in one piece.

Advantageously, the fastening holes 16 pass through the extra thickness 17 and the plate 18 in order to avoid a deformation of the plate 15.

The endless screw 14 is integral with a rod 20 terminating in a drive head 20a. This head is of special form, that is to say it cannot be actuated by means of a standard hexagon wrench. It has, for example, an irregular polygonal cross-section. Of course, the drive tool T5 has a matching form. Furthermore, it contains a built-in torque limiter T6. Thus, it becomes impossible for an unauthorized person to remove the box 1, and the box cannot be subjected to excessive forces capable of damaging the connector 9A, 9B in particular.

The locking mechanism is visible in FIG. 4. The rod 20 possesses grooves 21 over some of its length and a smooth bearing surface over the rest of its length. An attached support piece 22 has passing through it a bore serving as a bearing for the rod 20 over some of its length. This piece has passing through it, in the other part of its bore, two transverse bores 23, in each of which a ball 24 pushed by a spring 25 retained by screws 26 can move.

The two bores 23 form such an angle that, depending on the angular position of the rod 20, either one of the balls engages in a groove.

FIG. 5 shows the end of the rod 20 held by a bearing 27 integral with the plate 15.

As can be seen, the actuating and locking assembly is of great simplicity and of a bulk reduced considerably in comparison with the prior art.

What we claim is:

1. A removable electrical or electronic equipment assembly comprising:

a box containing the electrical or electronic equipment;

a housing for receiving said box;

at least one plug connector comprising a first element provided on said box and a second element provided within said housing, the first and second elements adapted to engage with one other;

an endless screw provided on said box;

a rack located within said housing and adapted to rotatably receive said endless screw;

first guide pieces located on said box;

second guide pieces located within said housing, said second guide pieces being spaced apart from said rack and adapted to be in sliding contact with said first guide pieces;

means for blocking the rotation of said endless screw when the first and second elements are engaged; and means for releasing said endless screw when the first and second elements are disengaged, whereby upon rotation of said endless screw in one direction, said box travels into said housing via said guide pieces until the first and second elements are engaged and the screw rotation is blocked by said blocking means, and whereby said box is removed upon rotation of said screw in an opposite direction.

2. The assembly as claimed in claim 1, wherein the box and its housing are parallelepipedic, wherein the first guide pieces are located near edges of a face of said box which carries said screw.

3. The assembly as claimed in claim 1, further comprising guide means independent of said first and second guide pieces, these guide means being located near the endless screw and the rack and being adapted to guide said endless screw into reception by said race when said box comes into the vicinity of its position of complete engagement in the housing.

4. The assembly as claimed in claim 1, wherein the endless screw can be driven in rotation by a rod equipped with a drive head intended for interacting with a took, wherein the endless screw is in one piece with the said rod and its drive head, and wherein it is retained on a support connected to the box by means of two bearings, at least one of which is attached.

5. The assembly as claimed in claim 4, wherein said rod has grooves or serrations for interacting with at least one ball pushed by a spring, these grooves or serrations forming, with said ball and its spring, part of the means for blocking the endless screw.

6. The assembly as claimed in claim 1, wherein the endless screw can be driven in rotation by a rod equipped with a drive head intended for interacting with a corresponding non-standard tool for driving the head.

7. The assembly as claimed in claim 6, wherein said corresponding non-standard tool includes a torque limiter.

* * * * *